(12) United States Patent
Lee

(10) Patent No.: US 7,585,692 B2
(45) Date of Patent: Sep. 8, 2009

(54) THIN FILM LAYER, HEATING ELECTRODE, PHASE CHANGE MEMORY INCLUDING THIN FILM LAYER AND METHODS FOR FORMING THE SAME

(75) Inventor: Choong-Man Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 236 days.

(21) Appl. No.: 11/324,381

(22) Filed: Jan. 4, 2006

(65) Prior Publication Data

US 2006/0145199 A1    Jul. 6, 2006

(30) Foreign Application Priority Data

Jan. 4, 2005    (KR) ...................... 10-2005-0000375

(51) Int. Cl.
    *H01L 21/00*    (2006.01)
(52) U.S. Cl. ......................................... 438/54; 438/688
(58) Field of Classification Search ................. 438/688, 438/54
    See application file for complete search history.

(56) References Cited

U.S. PATENT DOCUMENTS 7,164,147 B2 *    1/2007    Lee et al. ........................ 257/4

FOREIGN PATENT DOCUMENTS

| KR | P1999-0051335 | 7/1999 |
| KR | 100252049 B1 | 1/2000 |
| KR | 1020010066730 A | 7/2001 |

OTHER PUBLICATIONS

Lee, Yong Ju "Controlling the composition of Ti1-xAlxN thin films by modifying the number of TiN and AlN subcycles in atomic layer deposition" J. Vac. Sci. Technol. A 21(5), Sep. 2003 p. L13-L15.*
Shin, Young-Hoon "Chemical Vapor Deposition of TiAlN film by Using Titanium Tetrachloride, Dimethylethylamine Alane and Ammonia Gas for ULSI Cu Diffusion Barrier Application" Jap. Journal of App. Physics vol. 43, No. 12, 2004 p. 8253-8257.*
Juppo, Marika "In Situ Mass Spectrometry Study on Surface Reactions in Atomic Layer Deposition of TiN and Ti(Al)N Thin Films" Chem. Mater. 2002 14 pp. 281-287.*
Korean Office Action date Mar. 27, 2006 with English translation.

* cited by examiner

*Primary Examiner*—N Drew Richards
*Assistant Examiner*—Grant S Withers
(74) *Attorney, Agent, or Firm*—Harness, Dickey & Pierce, P.L.C.

(57) ABSTRACT

A thin film layer, a heating electrode, a phase change memory including the thin film layer, and methods for forming the same. The method of forming the thin film layer by atomic layer deposition (ALD) may include injecting a titanium (Ti) source, a nitrogen (N) source, and/or an aluminum (Al) source onto a substrate at different flow rates and for different periods of time. The heating electrode may include a $Ti_{1-x}Al_xN$ layer, wherein x is about $0.4<x<0.5$ at a first portion of the heating electrode contacting a phase change layer and $0<x<0.1$ at other portions of the heating electrode. The phase change memory may include the heating electrode including the $Ti_{1-x}Al_xN$ layer, an insulating layer formed on the heating electrode and having a contact hole exposing the heating electrode and the phase change layer contacting the first portion of the heating electrode.

15 Claims, 4 Drawing Sheets

THIN FILM LAYER, HEATING ELECTRODE, PHASE CHANGE MEMORY INCLUDING THIN FILM LAYER AND METHODS FOR FORMING THE SAME

PRIORITY CLAIM

A claim of priority under 35 U.S.C. §119 is made to Korean Patent Application No. 10-2005-0000375, filed on Jan. 4, 2005, in the Korean Intellectual Property Office, the disclosure of which is incorporated herein in its entirety by reference.

BACKGROUND OF THE INVENTION

1. Field of the Invention

Example embodiments of the present invention relate to a thin film layer, a heating electrode, a phase change memory including the thin film layer, and methods for forming the same. More particularly, example embodiments of the present invention relate to a method of forming a titanium aluminum nitride ($Ti_{1-x}Al_xN$) layer by atomic layer deposition (ALD) and a phase change memory device manufactured using the same.

2. Description of the Related Art

Typically, a thin film may be used as a dielectric layer of a semiconductor device, a transparent conductor of a liquid-crystal display, and/or a protective layer of an electroluminescent thin film display.

Thin films may be formed using a sol-gel method, a sputtering method, an electroplating method, an evaporation method, a chemical vapor deposition method, and/or atomic layer deposition (ALD). ALD may result in better step coverage than the chemical vapor deposition method. In addition, ALD may be performed at a lower manufacturing temperature.

A titanium aluminum nitride ($Ti_{1-x}Al_xN$) layer may be formed by ALD. Recently, the use of $Ti_{1-x}Al_xN$ layer has increased due to its excellent oxidation prevention characteristics. If a $Ti_{1-x}Al_xN$ layer is formed by conventional ALD, constituent of Al may be controlled by repeating the number of cycles in forming a TiN layer and an AlN layer or by controlling a reaction temperature. However, a deposition rate may be too low when employing these methods. Further, if $Ti_{1-x}Al_xN$ layer is formed at a low temperature, a composition of the $Ti_{1-x}Al_xN$ layer may change and constituent of impurities therein may increase, thereby decreasing the quality of the $Ti_{1-x}Al_xN$ layer.

FIG. 1 is a schematic diagram of a conventional apparatus used to form a thin layer by atomic layer deposition (ALD).

Referring to FIG. 1, a thin layer forming apparatus may include a reaction chamber 11 that may be heated by an external heater (not shown), a substrate 13, for example, a silicon substrate, a susceptor 15 to support the substrate 13. The apparatus further includes a shower head 17 through which reaction gases may be injected onto the substrate 13. The reaction chamber 11 may further include a vacuum pump (not shown) used to control an interior pressure of the reaction chamber 11.

A shower head 17 may include a first shower head 17a and a second shower head 17b. The first shower head 17a may be connected to a first gas inlet 21, and the second shower head 17b may be connected to a second gas inlet 19. The first gas inlet 21 may be used to inject a nitrogen source, for example, $NH_3$ gas into a reaction chamber 11. The second gas inlet 19 may be used to inject a titanium source, for example, $TiCl_4$ gas, and an aluminum source, for example, TMA [Al($CH_3$)$_3$] into the reaction chamber 11. It is understood that other types of source gases may be used. The above disclosed source gases are illustrated for example purposes.

Both the first gas inlet 21 and the second gas inlet 19 may be used to inject an inert gas, for example, Ar gas into the reaction chamber 11. Injection of Ar gas, TiCl4 gas, TMA, and NH3 gas may be controlled by a first valve V1, a second valve V2, a third valve V3, and a fourth valve V4, respectively.

SUMMARY OF THE INVENTION

In an example embodiment of the present invention, a method of forming a thin film layer by atomic layer deposition (ALD) includes injecting a titanium source into a reaction chamber in which a substrate is disposed, injecting a first nitrogen source into the reaction chamber, and injecting an aluminum source into the reaction chamber, wherein a concentration of Al in the thin film layer is controlled by varying at least one of an injection time and a flow rate of at least one of the titanium source, the nitrogen source, and the aluminum source.

In an example embodiment of the present invention, the flow rate of at least one gas and/or an injection time of least one gas control the concentration of Al in the thin film layer.

In an example embodiment of the present invention, the flow rate of at least one gas and/or an injection time of least one gas in an ALD process, control the concentration of Al in the thin film layer.

In an example embodiment of the present invention, the flow rate of the first nitrogen source and/or the injection time of the first nitrogen source control the concentration of Al in the thin film layer.

In an example embodiment of the present invention, the flow rate of the aluminum source and/or the injection time of the aluminum source control the concentration of Al in the thin film layer.

In an example embodiment of the present invention, the thin film layer formed is a $Ti_{1-x}Al_xN$ layer.

In an example embodiment of the present invention, wherein injecting the first nitrogen source into the reaction chamber occurs before injecting the aluminum source into the reaction chamber and the method further includes a second nitrogen source into the reaction chamber containing the aluminum source.

In an example embodiment of the present invention, the flow rate of the second nitrogen source and/or the injection time of the second nitrogen source control the concentration of Al in the thin film layer.

In another example embodiment of the present invention, a method of forming a phase change memory device includes forming a heating electrode by forming a thin film layer, forming an insulating layer on the heating electrode, having a contact hole which exposes the heating electrode, and forming a phase change layer on the insulating layer, filling the contact hole and contacting the heating electrode.

In an example embodiment of the present invention, a heating electrode includes at least one $Ti_{1-x}Al_xN$ layer, wherein X is 0.4<X<0.5 in a first portion of the heating electrode and 0<X<0.1 in other portions of the heating electrode.

In an example embodiment of the present invention, phase change memory device includes a heating electrode, an insulating layer on the heating electrode, having a contact hole which exposes the heating electrode; and a phase change layer on the insulating layer, filling the contact hole and contacting the heating electrode.

In an example embodiment of the present invention, the heating electrode includes N (where N is an integer $\geq 2$) $Ti_{1-x}Al_xN$ layers stacked sequentially, the insulating layer on the Nth $Ti_{1-x}Al_xN$ layer of the heating electrode the contact hole of the insulating layer exposing the Nth $Ti_{1-x}Al_xN$ layer, and the phase-change layer filling the contact hole and contacting the Nth $Ti_{1-x}Al_xN$ layer, wherein X increases from the first $Ti_{1-x}Al_xN$ layer to the Nth $Ti_{1-x}Al_xN$ layer.

BRIEF DESCRIPTION OF THE DRAWINGS

The above and other aspects of the present invention will become more apparent by describing in detail example embodiments thereof with reference to the attached drawings in which.

DETAILED DESCRIPTION OF EXAMPLE EMBODIMENTS OF THE PRESENT INVENTION

Figure 1:
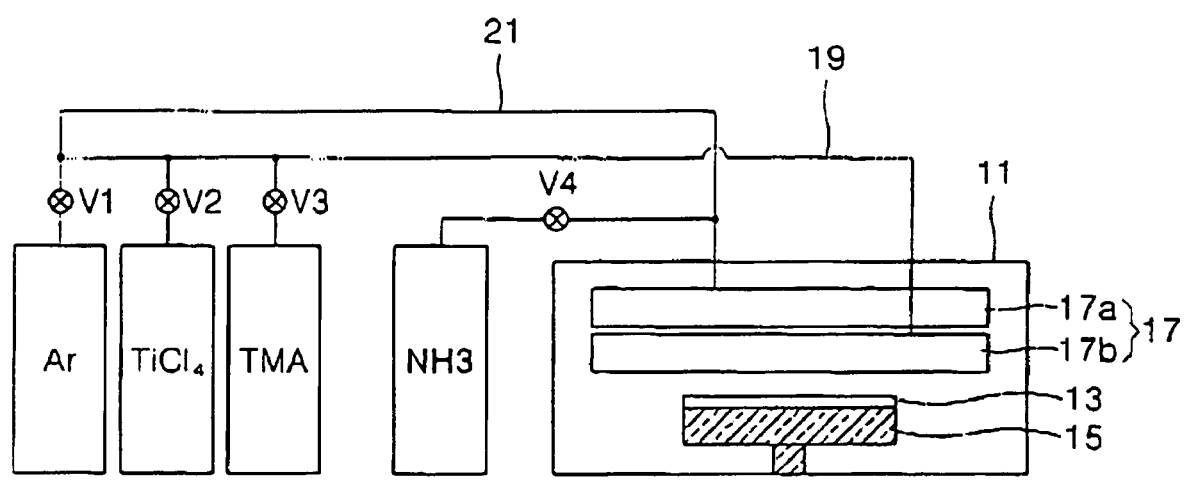
FIG. 1 is a schematic diagram of a conventional apparatus used to form a thin layer by atomic layer deposition (ALD)

The present invention will now be described more fully with reference to the accompanying drawings, in which example embodiments of the present invention are shown. The present invention may, however, be embodied in many different forms and should not be construed as being limited to the example embodiments set forth herein; rather, the example embodiments are provided as working examples. In the drawings, the thicknesses of layers and regions may be exaggerated for clarity. Like reference numerals in the drawings may denote like elements, and thus their description may be omitted.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, for example, "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, the example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, for example, those defined in commonly used dictionaries, should be interpreted as having a meaning that is consistent with their meaning in the context of the relevant art and will not be interpreted in an idealized or overly formal sense unless expressly so defined herein.

Figure 2:
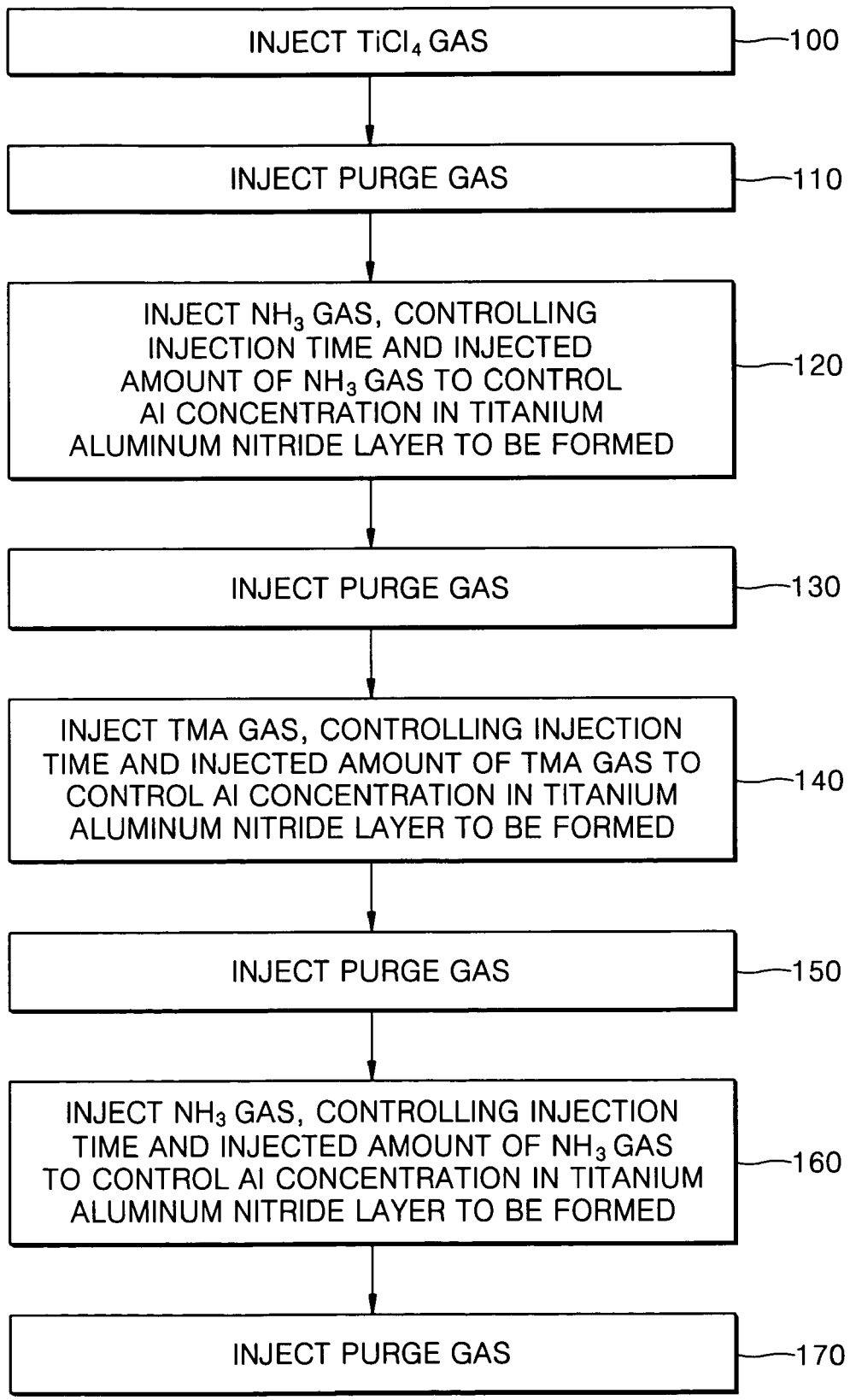
FIG. 2 is a flow chart illustrating a method of forming a $Ti_{1-x}Al_xN$ layer by ALD by using the apparatus illustrated in FIG. 1 according to an example embodiment of the present invention.
Figure 3:
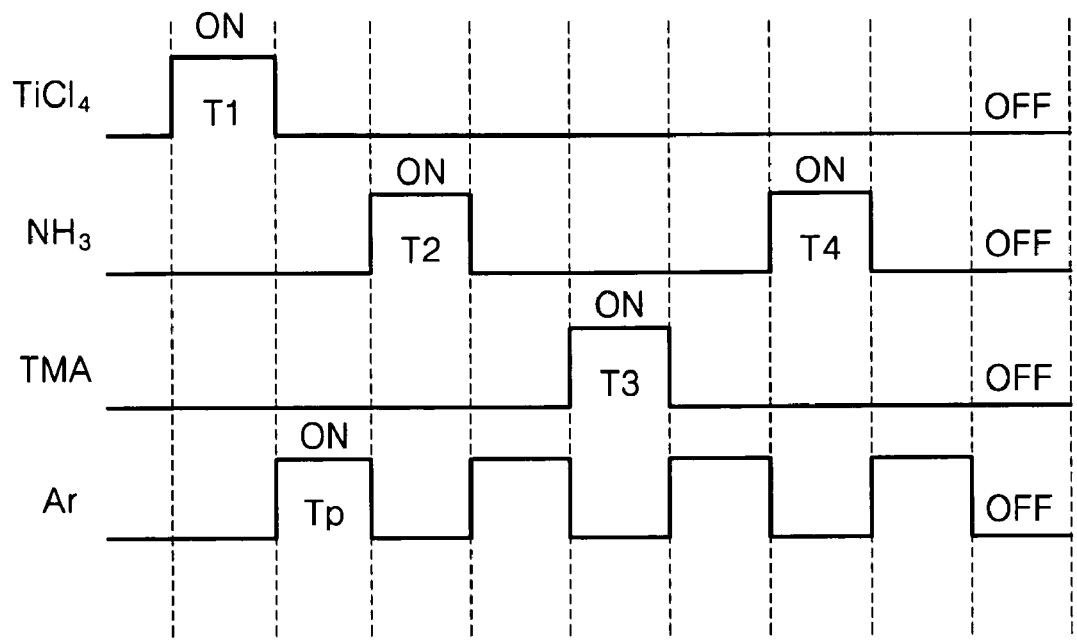
FIG. 3 is a timing diagram illustrating a sequence of injecting source gases used when forming a thin film layer according to an example embodiment of the present invention.

FIG. 2 is a flow chart illustrating a method of forming a thin film layer, for example, $T_{i1-x}Al_xN$ layer by ALD using the apparatus illustrated in FIG. 1 according to an example embodiment of the present invention. FIG. 3 is a timing diagram illustrating a sequence of injecting source gases used to form a thin film layer according to an example embodiment of the present invention.

Referring to FIGS. 1 to 3, an interior of a reaction chamber 11 may have a desired pressure, for example, 1 Torr, and a temperature of 300 to 600° C., for example, 450° C. A titanium source, for example, TiCl$_4$ gas may be injected into the reaction chamber 11 having a substrate 13 for a period of T1 (100). T1 may be 1 second and an injected amount of titanium source may be 16 sccm. An inert gas, for example, Ar gas, which may be used as a purging gas, may be injected into the reaction chamber 11 to purge unreacted titanium source gas (110). In an example embodiment of the present invention, the purge rate of the inert gas may be 500 sccm.

A nitrogen source, for example, NH$_3$ gas, may be injected into the reaction chamber 11 for a period of T2 (120) at an amount of 450 sccm. T2 may be 1 second. The injected NH$_3$ gas may react with the TiCl$_4$ gas in the reaction chamber 11 to generate TiN and HCl. An Al constituent in a to-be-formed Ti$_{1-x}$Al$_x$N layer may be controlled by adjusting the injected amount of the nitrogen source and/or T2. Ar gas may be injected into the reaction chamber 11 at an amount of 500 sccm to purge unreacted source gas (130).

An aluminum source, for example, TMA [Al (CH$_3$)$_3$] may be injected into the reaction chamber 11 for a period of T3 by bubbling Ar gas at an amount of 200 sccm in a TMA solution for 0.4 or 0.5 second (140). The TiN may react with the aluminum source to generate a Ti$_{1-x}$Al$_x$N layer. The Al constituent in the to-be-formed Ti$_{1-x}$Al$_x$N layer may be controlled by adjusting the injection amount of the aluminum source and/or T3. Ar gas may be injected into the reaction chamber 11 at an amount of 500 sccm to purge unreacted source gas (150). T2 may be greater than T3, and the flow rate of the nitrogen source may be greater than the flow rate of the Al source.

The nitrogen source, for example, NH$_3$ gas, may be injected into the chamber 11 for a period of T4 (160) at an amount of 450 sccm. The period T4 may be 2 seconds. The injected amount of the nitrogen source and/or T4 may be controlled such that the thickness and uniformity of the Ti$_{1-x}$Al$_x$N layer may be desirably adjusted. Ar gas may be injected into the reaction chamber 11 at an amount of 500 sccm to purge unreacted source gas (170). T4 may be greater than T2; T2 may be greater than T3; the flow rate of the second nitrogen source may be equal to the flow rate of the first nitrogen source; and/or the flow rate of the nitrogen source may be greater than the flow rate of the Al source.

In an example embodiment of the present invention, a Ti$_{1-x}$Al$_x$N layer may be formed by performing only processes 100 to 150; in another example embodiment of the present invention, the method may optionally include processes 160 and 170.

As described above, an Al constituent in a Ti$_{1-x}$Al$_x$N layer may be adjusted by controlling an injected amount of nitrogen gas and/or controlling an injection time of the nitrogen gas. That is, in conventional ALD, a composition of the Ti$_{1-x}$Al$_x$N layer may be determined by repeating number of cycles of forming a TiN layer and an AlN layer. In example embodiments of the present embodiment, a composition of a Ti$_{1-x}$Al$_x$N layer may be determined by T2 and/or T3.

In addition, an injection time of TMA, an amount of injected TMA, a first injection time of nitrogen, and/or a first amount of injected nitrogen may affect an Al constituent in the Ti$_{1-x}$Al$_x$N layer. For example, the Al constituent in the Ti$_{1-x}$Al$_x$N layer may be more dependent on the first injection time and/or the first amount of injected nitrogen source because if NH$_3$ is present on a surface of a TiN layer, the TMA may be chemically absorbed. Resistivity of a Ti$_{1-x}$Al$_x$N layer may directly depend on an Al constituent (x), and a component ratio of Al added to a TiN may be controlled to control the composition of the Ti$_{1-x}$Al$_x$N layer.

Accordingly, in an example embodiment of the present invention, T2 and/or T3 may be controlled such that an amount of Al (x) contained in a Ti$_{1-x}$Al$_x$N layer may be 0<X<0.5. If 0<X<0.25, a resistivity may be in a range of 300 to 800 μΩcm. If 0.35<X<0.5, a resitivity is in a range of 2000 to 5000 μΩcm. As disclosed above, a Ti$_{1-x}$Al$_x$N layer may be formed to a thickness of 3.0 to 6.0 Å in a single cycle without increasing processing temperature.

FIG. 3 illustrates an example sequence of "pulses" of TiCl$_4$, NH$_3$, and TMA. As shown in FIG. 3, the sequence may include pulses of TiCl$_4$, NH$_3$, TMA, NH$_3$, etc. In other example embodiments, the amplitude or flow rate (the "Y" axis value) may vary for the TiCl$_4$, NH$_3$, and/or TMA pulses. In other example embodiments, the duration or injection times (the "X" axis value), as discussed in various other portions herein, may vary for the TiCl$_4$, NH$_3$, and/or TMA pulses. FIG. 3 illustrates an example sequence of "pulses" which make up one cycle. In other embodiments, the number of cycles may be greater than one. In other embodiments, the injection times of any source in a given cycle (or across cycles) may be the same or different. In other embodiments, the flow rates of the nitrogen source in a given cycle (or across cycles) may be the same or different. In other embodiments, the total injection time of each source per given cycle may vary cycle to cycle. For example, the injection time and the flow rate of the titanium and/or aluminum source may be the same or different from a first cycle to a second cycle. Also, FIG. 3 illustrates the order of titanium source, first nitrogen source, aluminum source, and second nitrogen source, but, as discussed in various other portions herein, the order of the sources gases may not only vary, but the number of application of a specific gas source may increase or decrease in a given cycle (or across cycles).

Figure 4:
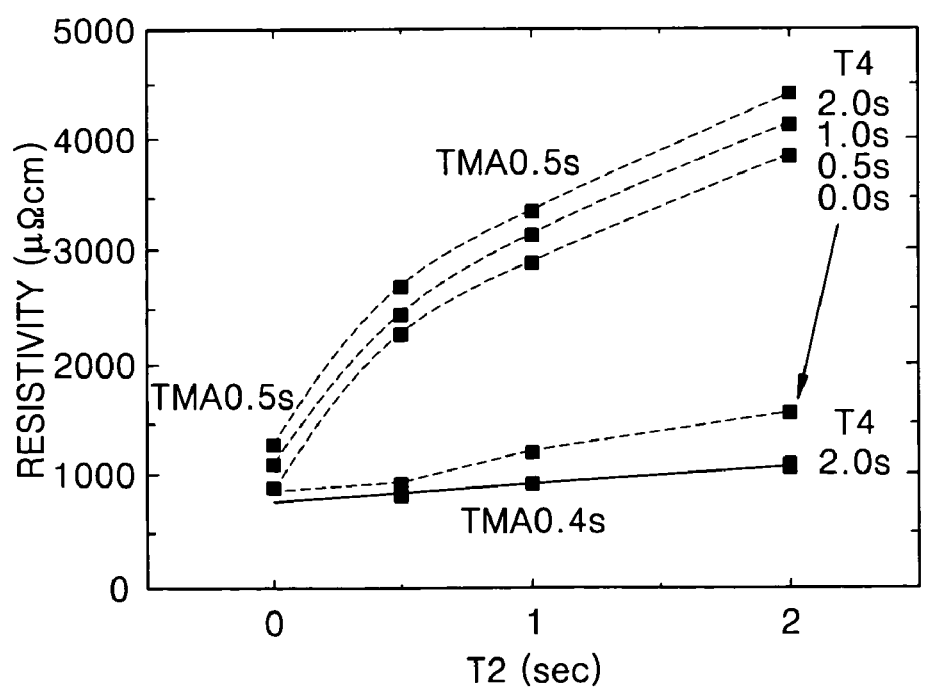
FIG. 4 is a resistivity graph with respect to the injection time of a source gas when using the method illustrated in FIG. 2 according to an example embodiment of the present invention.

FIG. 4 is a resistivity graph with respect to an injection time of a source gas according to an example embodiment of the present invention.

Referring to FIG. 4, the X axis represents T2 and the Y axis represents resistivity. The resistivity may increase with respect to T2, which may be due to a change in an Al constituent in a Ti$_{1-x}$Al$_x$N layer. A solid line represents T3 at 0.4 second. Dotted lines represent T3 at 0.5 second, and T4 at 0.0, 0.5, 1.0, and 2.0 seconds.

The graph in FIG. 4 shows that the resistivity substantially increased when T3 is at 0.5 second as compared when T3 is at 0.4 second, and the change of resisitivity is smaller with respect to a change of T4 than with respect to a change of T2.

For example, when T2 was 0 second, T4 was in a range of about 0.5 to 2.0 seconds, and T3 was 0.5 second, an amount of Al (x) of a Ti$_{1-x}$Al$_x$N layer was in a range of about 0.26 to 0.34. When T2 was 1 second, T4 was in the range of 0.5 to 2.0 seconds, and T3 was 0.4 second, an amount of Al (x) of the Ti$_{1-x}$Al$_x$N layer was in a range of about 0.18 to 0.24. When T2 was 1 second, T4 was in the range of 0.5 to 2.0 seconds, and T3 was 0.5 second, the amount of Al (x) of the Ti$_{1-x}$Al$_x$N layer was in the range of about 0.36 to 0.44.

An injection time Ti or an injected amount of TiCl$_4$, or an injection time T2 or an injected amount of NH$_3$ may be adjusted such that 0<X<0.5 and a resistivity may be in a range of 300 to 5000 μΩcm. When 0<X<0.25, a resistivity of a Ti$_{1-x}$Al$_x$N layer may be in a range of 300 to 800 μΩcm. When 0.35<X<0.5, a resistivity of the Ti$_{1-x}$Al$_x$N layer may be in a range of 2000 to 5000 μΩcm.

As described above, according to an example embodiment of the present invention, a resistivity may be adjusted by changing an Al constituent (x) of a Ti$_{1-x}$Al$_x$N layer, which may be formed by ALD. The $Ti_{1-x}Al_xN$ layer may be used as a heating electrode for a phase-change memory device.

Figure 5:
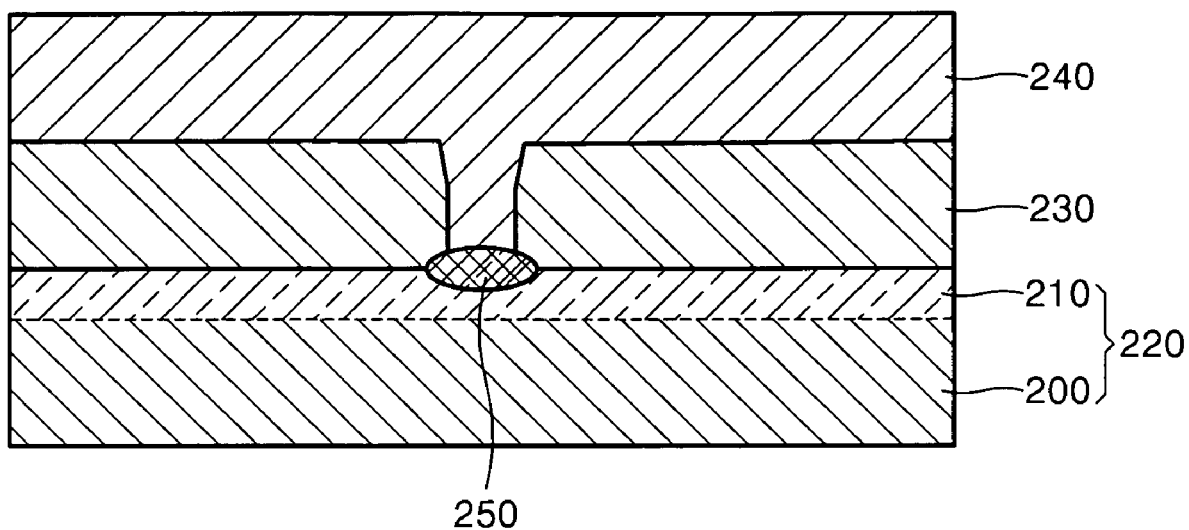
FIG. 5 is a sectional view of a phase change memory device manufactured according to an example embodiment of the present invention.

FIG. 5 is a sectional view of a phase change memory device having a thin film layer used manufactured according to an example embodiment of the present invention.

Referring to FIG. 5, a heating electrode 220 may include thin film layer, for example, $Ti_{1-x}Al_xN$ layer. $Ti_{1-x}Al_xN$ layer may be deposited on a silicon substrate (not shown). An insulating layer 230 having a contact hole may be formed on the heating electrode 220. A contact hole may expose the heating electrode 220. A phase-change layer 240 to fill the contact hole may be formed on the insulating layer 230 to contact the heating electrode 220. The phase-change layer 240 may be composed of a chalcogenide alloy. Chalcogenide materials are widely used as the phase change material. Among the chalcogenide materials, a compound material layer (GST) containing germanium (Ge), antimony (Sb) and tellurium (Te) is widely used in phase change memory.

For example, the phase change material may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Gel_{15}$—$Sb_2$—$S_2$ alloy, for example.

In an example embodiment, the phase change material may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$).

The heating electrode 220 may include a first $Ti_{1-x}Al_xN$ layer 200 and a second $Ti_{1-x}Al_xN$ layer 210 (or additional $Ti_{1-x}Al_xN$ layers). The first $Ti_{1-x}Al_xN$ layer 200 and the second $Ti_{1-x}Al_xN$ layer 210 may be physically separated or may be two distinct layers contacting each other. The first $Ti_{1-x}Al_xN$ layer 200 and the second $Ti_{1-x}Al_xN$ layer 210 may be separated in view of a property of matter. That is, if the heating electrode 220 is formed by ALD, injection times of a nitrogen source or injection times of an Al source may be varied to form distinct first and second $Ti_{1-x}Al_xN$ layers 200, 210.

At a portion 250 of the heating electrode 220 contacting the phase-change layer 240, 0.4<X<0.5. In the other portion of the heating electrode 220, 0<X<0.1. In other words, the portion 250 of the heating electrode 220 contacting the phase-change layer 240 has a higher resistivity, and the other portions of the heating electrode 220, which do not contact the phase-change layer 240, have lower resistivity.

Therefore, only the portion 250 of the heating electrode 220 contacting the phase-change layer 240 may be well heated. In addition, because the resistivity of the other portion, for example, the first $Ti_{1-x}Al_xN$ layer 200 portion, of the heating layer 220 may be reduced by decreasing an Al constituent, an electrical conductivity of the other portion of the heating layer 220 may increase, thus improving electric signal transmittance between phase-change cells. That is, the phase-memory device according to an example embodiment of the present invention may have higher energy efficiency and/or a lower reset current than a conventional phase-change memory device.

According to example embodiments of the present invention, if a $Ti_{1-x}Al_xN$ layer is formed by ALD, x can be controlled between about 0 and 0.5 by adjusting an injection time of a nitrogen source or an aluminum source. Accordingly, the resistivity of the $Ti_{1-x}Al_xN$ layer may be controlled within a range of about 300 to 5000 μΩcm.

A $Ti_{1-x}Al_xN$ layer formed by ALD according to example embodiments of the present invention may be used as a heating electrode of a phase change memory device. The phase change memory device may include the $Ti_{1-x}Al_xN$ layer as a heating electrode, and may have higher energy efficiency and/or a lower reset current than a conventional phase-change memory device.

While the present invention has been particularly shown and described with reference to example embodiments thereof, it will be understood by those of ordinary skill in the art that various changes in form and details may be made therein without departing from the scope of the example embodiments of the present invention.

What is claimed is:

1. A method of forming a phase change memory device comprising:
    forming a heating electrode by forming a titanium aluminum nitride ($Ti_{1-x}Al_xN$) layer;
    forming an insulating layer on the heating electrode, the insulating layer having a contact hole which exposes the heating electrode; and
    forming a phase change layer on the insulating layer, filling the contact hold and contacting the heating electrode,
    wherein the $Ti_{1-x}Al_xN$ layer is formed by atomic layer deposition (ALD), the formation method comprising one cycle including:
        injecting a titanium source into a reaction chamber in which a substrate is disposed;
        injecting a first nitrogen source into the reaction chamber; and
        injecting an aluminum source into the reaction chamber;
        wherein a concentration of Al(X) in the $Ti_{1-x}Al_xN$ layer is controlled by varying at least one of an injection time and a flow rate of at least one of the nitrogen source and the aluminum source, and wherein the $Ti_{1-x}Al_xN$ layer is formed to a thickness of 3.0 to 6.0 Å per cycle.

2. The method of claim 1, further comprising injecting purging gas onto the substrate after injecting at least one of the titanium source, the first nitrogen source, and the aluminum source.

3. The method of claim 1, wherein the flow rate of the first nitrogen source and the injection time of the first nitrogen source control the concentration of Al in the $Ti_{1-x}Al_xN$ layer.

4. The method of claim 3, wherein the flow rate of the aluminum source and the injection time of the aluminum source control the concentration of Al in the $Ti_{1-x}Al_xN$ layer.

5. The method of claim 1, wherein the titanium source is $TiCl_4$.

6. The method of claim 1, wherein the first nitrogen source is $NH_3$.

7. The method of claim 1, wherein the aluminum source is TMA.

8. The method of claim 1, wherein $0<X<0.5$.

9. The method of claim 8, wherein, when $0<X<0.25$, the resistivity the $Ti_{1-x}Al_xN$ layer is in the range of 300 to 800 $\mu\Omega cm$.

10. The method of claim 8, wherein, when $0.35<X<0.5$, the resistivity of the $Ti_{1-x}Al_xN$ layer is in the range of 2000 to 5000 $\mu\Omega cm$.

11. The method of claim 1, wherein injecting the first nitrogen source into the reaction chamber occurs before injecting the aluminum source into the reaction chamber, the method further comprising:
    injecting a second nitrogen source into the reaction chamber containing the aluminum source.

12. The method of claim 11, further comprising injecting purging gas onto the substrate after injecting at least one of the titanium source, the first nitrogen source, the aluminum source, and the second nitrogen source.

13. The method of claim 11, wherein the flow rate of the aluminum source and the injection time of the aluminum source control the concentration of Al in the $Ti_{1-x}Al_xN$ layer.

14. The method of claim 13, wherein the flow rate of the second nitrogen source and the injection time of the second nitrogen source control the concentration of Al in the $Ti_{1-x}Al_xN$ layer.

15. The method of claim 11, wherein each of the first nitrogen source and the second nitrogen source is $NH_3$.

\* \* \* \* \*